United States Patent [19]

Schmidt

[11] Patent Number: 5,270,557
[45] Date of Patent: Dec. 14, 1993

[54] QUANTUM INTERFERENCE SEMICONDUCTOR DEVICE HAVING A QUANTUM POINT CONTACT AND FABRICATION PROCESS THEREOF

[75] Inventor: Poul E. Schmidt, Les Ulis, France

[73] Assignee: Fujitsu Limited, Kawasaki, Japan

[21] Appl. No.: 691,733

[22] Filed: Apr. 26, 1991

[30] Foreign Application Priority Data

Apr. 28, 1990 [JP] Japan .................................. 2-112318

[51] Int. Cl.$^5$ .......................................... H01L 29/80
[52] U.S. Cl. ................................ 257/194; 257/270; 257/280; 257/472
[58] Field of Search ................ 257/194, 26, 27, 29, 257/192, 472, 471, 183, 270, 280, 24

[56] References Cited

U.S. PATENT DOCUMENTS

| | | | |
|---|---|---|---|
| 4,962,410 | 10/1990 | Kriman et al. | 357/15 |
| 4,977,435 | 12/1990 | Yoshimura et al. | 257/194 |
| 4,996,570 | 2/1991 | Van Houten et al. | 257/194 |
| 5,051,791 | 9/1991 | Baldwin et al. | 257/183 |

FOREIGN PATENT DOCUMENTS 61-54675  3/1986  Japan .................................. 257/194

OTHER PUBLICATIONS

Nakamura, K., et al., "Electron Focusing . . ." Appl. Phys. Lett; Jan. 22, 1990, pp. 385-386.

Primary Examiner—Sara W. Crane
Attorney, Agent, or Firm—Staas & Halsey

[57] ABSTRACT

A quantum interference semiconductor device comprises a channel layer of a first semiconductor material, a carrier supplying layer of a second semiconductor material provided on the channel layer and whereby a two-dimensional carrier gas is formed in the channel layer along an upper major surface thereof, a source electrode provided on the carrier supplying layer for injecting carriers, a drain electrode provided on the carrier supplying layer and displaced from the source electrode in a first direction defining a region of the channel layer therebetween which collects the injected carriers after travelling through the carrier gas in the first direction and a gate electrode structure provided on the region of the carrier supplying layer and in Schottky contact therewith. The gate electrode structure includes first and second opposing Schottky electrodes spaced in a second direction transverse to the first direction from each other and defining a gap therebetween and producing corresponding depletion regions extending into the channel layer which interrupt the flow of carriers in the first direction through the two-dimensional gas. At least one isolated Schottky electrode is formed on the upper major surface of the carrier supplying layer in the gap and in Schottky contact therewith and forms a corresponding depletion region defining corresponding passageways for carriers moving in the form of a quantum mechanical wave at each of the opposite sides thereof, relative to the corresponding depletion regions of the first and second opposing Schottky electrodes. At least one conductor strip, corresponding to and electrically contacting the isolated Schottky electrode, extends along the upper major surface of the carrier supplying layer in spaced relationship therefrom. Separately controlled, individual control voltages are supplied to the respective Schottky electrodes.

6 Claims, 8 Drawing Sheets

QUANTUM INTERFERENCE SEMICONDUCTOR DEVICE HAVING A QUANTUM POINT CONTACT AND FABRICATION PROCESS THEREOF

BACKGROUND OF THE INVENTION

The present invention generally relates to semiconductor devices, and in particular to a quantum interference semiconductor device having a quantum point contact or restricted quantizing region.

With the progress of so-called submicron patterning, semiconductor devices having the structural elements of a size in the order of 1 micron or less are becoming available. In such devices, the wave nature of electrons and holes becomes conspicuous. In other words, one has to treat these particles as waves rather than classical particles. This tendency is enhanced with the decreasing device size.

The quantum interference semiconductor device is a semiconductor device that utilizes the wave nature of electrons and holes for operation. For example, the U.S. patent application Ser. No. 473,167 in which the assignee is the same assignee of the present invention, describes a quantum interference semiconductor device wherein an electron wave of a single electron is slitted into two or more electron waves and passed through respective quantum point contacts.

The quantum point contact is a region having a lateral size smaller than the de Broglie length of electrons in the direction perpendicular to the propagating direction and causes a quantization of the electron wave passing therethrough. Further, the quantum point contact is characterized by a restricted longitudinal length in the propagating direction of the electron wave such that the longitudinal length is smaller than the elastic or inelastic length of the electrons.

Upon passage of the quantum point contact, the electron wave experiences a change in the wavelength due to the quantized energy level or quantum level of the quantum point contact. Thereby, the phase of the electron wave is modulated. Upon merging of the electron waves which have passed through respective quantum point contacts, there occurs a constructive or destructive interference of the electron waves. Thus, when there occurs a constructive interference, a high level output is obtained at the output of the quantum interference semiconductor device, while when there occurs a destructive interference, a low level output is obtained.

FIGS. 1(A)-1(D) are diagrams for explaining the foregoing principle of the quantum interference semiconductor device having the quantum point contact, wherein FIG. 1(A) shows the device in the unbiased state in the plan view and FIG. 1(B) shows the device in the same state in the elevational cross section.

Referring to FIGS. 1(A) and 1(B), the quantum interference semiconductor device has an undoped channel layer 63 of GaAs and the like, and a doped layer 61 of $n^+$-type AlGaAs and the like, is provided on the layer 63 for supplying electrons to the channel layer 63. Between the channel layer 63 and the doped layer 61, an undoped AlGaAs layer 62 may be interposed. In such a structure, a two-dimensional electron gas 69 is formed in the channel layer 63 along the upper boundary thereof with the AlGaAs layer 62, as is well known.

On the upper major surface of the doped AlGaAs layer 61, there are provided a source electrode 65 and a drain electrode 66 in ohmic contact to with the underlying layer 61 as shown in the plan view of FIG. 1(A), and a pair of gate electrodes 67 and 68 are provided also on the upper major surface of the doped layer 61, in Schottky contact thereto therewith and located in correspondence to a region thereof between the source electrode 65 and the drain electrode 66.

FIGS. 1(C) and 1(D) show the same device in the biased state, wherein FIG. 1(C) corresponds to the plan view of FIG. 1(A) and FIG. 1(D) corresponds to the elevational cross section of FIG. 1(B).

Referring to FIGS. 1(C) and 1(D), a bias voltage is applied to the gate electrodes 67 and 68, and in correspondence thereto, there develop depletion regions 71 and 72 under the gate electrodes 67 and 68, respectively. As shown in the cross section of FIG. 1(D), the depletion regions 71 and 72 extend into the channel layer 63 and expel the electrons forming the two-dimensional electron gas 69. Thereby, the electrons are laterally confined into a region 74. The region 74 is confined also in the traveling direction of the electron waves such that the length of the region 74, measured in the traveling direction of the electron wave, is approximately smaller than the elastic and inelastic wavelength of electrons. Thus, region 74 forms a spot-like region called a quantum point contact.

As the separation between the gate electrodes 67 and 68 is set in the order of a few microns or less, one can confine the lateral width of this quantum point contact 74 approximately within the de Broglie length of electron by suitably choosing the bias voltage, and the energy level of electrons is quantized into one or more discrete quantum levels. It should be noted that the quantum level is changed in response to the extension of the depletion regions 71 and 72. In such a structure, the two-dimensional electron gas formed in the region between the source electrode 65 and the gate electrodes 67, 68 is connected to the two-dimensional electron gas formed in the region between the drain electrode 66 and the gate electrodes 67, 68, at the quantum point contact 74.

Thus, when an electron wave having an energy $E_F$ and a wavelength $k_F$ of:

$$k_F = (2mE_F)^{\frac{1}{2}}/\hbar$$

in the traveling direction has entered the quantum point contact 74, the wave number of the electron wave is changed to:

$$k_{F1} = [2m(E_F - E_{01})]^{\frac{1}{2}}/\hbar$$

where $E_F$ represents the Fermi level, m represents the mass of an electron, $\hbar$ represents the Plank's constant, and $E_{01}$ represents the quantum level formed in the region 74. In other words, the wavelength of the electron wave is controlled in response to the quantum level $E_{01}$ of the quantum point contact 74.

FIGS. 2(A)-2(C) are diagrams showing a prior art quantum interference semiconductor device proposed previously in the foregoing U.S. patent application Ser. No. 473,167.

Referring to FIGS. 2(A) and 2(B), the quantum interference semiconductor device has a structure substantially identical with the structure of FIGS. 1(A)-1(D) except that there is provided another Schottky electrode 75 between the gate electrodes 67 and 68. Thereby, the Schottky electrode 75 forms a depletion region 75a in the channel layer 63 as shown in FIG. 2(B). In correspondence to this, there are formed two quantum point contacts 74a and 74b such that the quantum point contact 74a is located between the gate electrode 67 and the electrode 75 in the plan view and such that the quantum point contact 74b is located between the gate electrode 68 and the electrode 75.

In each of the quantum point contacts, the wavelength of the electron waves is modified according to the foregoing equation. Thereby, by adjusting the quantum level of the quantum point contacts 74a and 74b appropriately, one can modify the wavelength of the electron waves passing through the quantum point contacts separately.

FIG. 2(C) shows the principle of operation of the quantum interference semiconductor device of FIGS. 2(A) and 2(B).

Referring to FIG. 2(C), an electron wave W0 of a single electron emitted from the source electrode 65 is split into two electron waves W1 and W2 which pass through the respective quantum point contacts 74a and 74b. Upon passing through the quantum point contacts 74a and 74b, the electron waves 74a and 74b merge with each other and undergo an interference therebetween. It should be noted that the absolute value of the wave function of an electron wave represents the probability of finding an electron and thus, there occurs conduction of the device when the electron waves W1 and W2 cause a constructive interference. On the other hand, when these electron waves cause a destructive interference, the semiconductor device is in the turned off state. Such an interference of the electron waves is controlled by controlling the quantum level $E_{01}$ of the quantum point contacts 74a and 74b independently, which in turn can be controlled by controlling the respective lateral extensions of the depletion regions 71 and 72 under the gate electrodes 67 and 68 independently in response to the corresponding gate voltages applied to the gate electrodes 67 and 68.

In this conventional quantum interference device, however, there arises a problem in that, as the electrode 75 between the gate electrodes 67 and 68 is in the floating state, the electric potential of the electrode 75 is not fixed but changes, variously, in response to the voltage between the gate electrodes 67 and 68 or in response to the voltage between the source and drain electrodes 65 and 66. It should be noted that when there is a potential gradient along the surface of the layer 61 between the electrode 67 and the electrode 68, the voltage level appearing on the electrode 75 assumes a value intermediate (i.e., between) the voltage level of the electrode 67 and the voltage level of the electrode 68.

It should be noted that the extension of the depletion region 75a, formed under the electrode 75 is determined in accordance with, and response to, the intermediate potential level of the electrode 75. Thus, when the potential level of the electrode 75 is changed, such a change induces a change in the quantum level of the quantum point contacts 74a and 74b by modifying the extension of the depletion region 75a under the electrode 75. Thus, such an uncontrolled change of the potential level of the electrode 75 can induce unstable device operation. Further, the change of the potential level of the electrode 75 may be caused by other reasons such as irradiation of light.

It should be noted that a similar problem occurs also when the depletion region 75a is formed by forming a depression or inactive region in the layer 61 in place of the electrode 75.

SUMMARY OF THE INVENTION

Accordingly, it is a general object of the present invention to provide a novel and useful quantum interference semiconductor device wherein the foregoing problems are eliminated.

Another object of the present invention is to provide a quantum interference semiconductor device having a plurality of quantum point contacts, wherein each quantum point contact is controlled independently and with reliability.

Another object of the present invention is to provide a quantum interference semiconductor device having a plurality of quantum point contacts, wherein the quantum point contacts are controlled simultaneously.

Another object of the present invention is to provide a quantum interference semiconductor device, comprising an undoped channel layer, a doped semiconductor layer provided on the undoped channel layer to form a two-dimensional carrier gas in the channel layer along an upper major surface of the channel layer, a source electrode provided on an upper major surface of the doped semiconductor layer in ohmic contact therewith for injecting carriers into the two-dimensional electron gas via the doped semiconductor layer, a drain electrode provided on the upper major surface of the doped semiconductor layer in ohmic contact therewith for collecting the carriers from the two-dimensional carrier gas via the doped semiconductor layer, first and second opposing gate electrodes provided on the upper major surface of the doped semiconductor layer in Schottky contact therewith with a gap formed between opposing ends thereof, an isolated Schottky electrode provided on the upper major surface of the doped semiconductor layer in correspondence to a part thereof between said opposing ends of the first and second gate electrodes and in Schottky contact therewith, said first gate electrode and said isolated Schottky electrode forming a first quantum point contact in the channel layer while said second gate electrode and said isolated Schottky electrode forming a second quantum point contact in the channel layer, and an interconnection structure connected to the Schottky electrode for controlling the voltage level thereof, wherein the interconnection structure forms an air bridge structure extending along and spaced from the upper major surface of the doped semiconductor layer, and thus with a separation therebetween. According to the present invention, the voltage level of the isolated Schottky electrode, and hence the potential level of the doped semiconductor layer in contact with the Schottky electrode, is fixed and the operation of the quantum interference semiconductor device is stabilized. Thereby, the influence of the bias voltage of the first and second gate electrodes on the depletion region under the isolated Schottky electrode is eliminated, and the control of the first and second quantum point contacts is achieved independently. Further, by providing a number of isolated Schottky electrodes between the first and second gate electrodes and connecting these Schottky electrodes with each other by the air bridge structure, the quantum interference semiconductor device can create a planar electron wave that propagates straight to the drain electrode with excellent directivity. Such a structure contributes to increasing transconductance and reducing noise during the operation.

Other objects and further features of the present invention will become apparent from the following de-

DETAILED DESCRIPTION

Figure 3A:
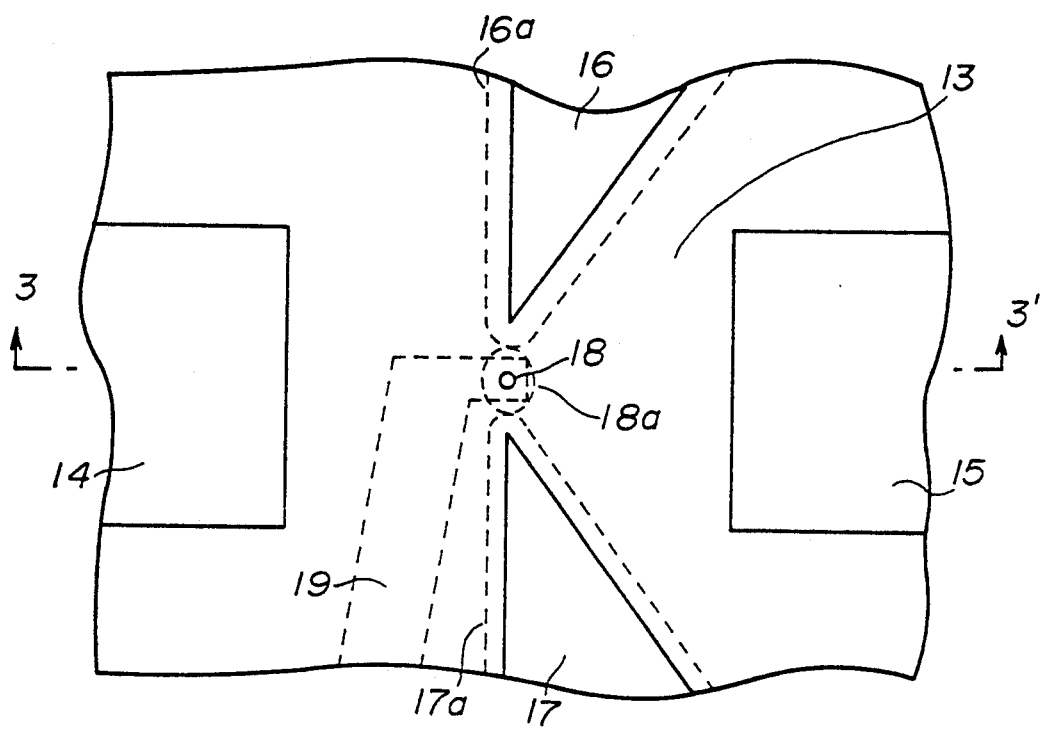
FIGS. 3(A) and 3(B) are respectively plan and cross-sectional illustrations of the fundamental structure of a quantum interference semiconductor device according to a first embodiment of the present invention.
Figure 3B:
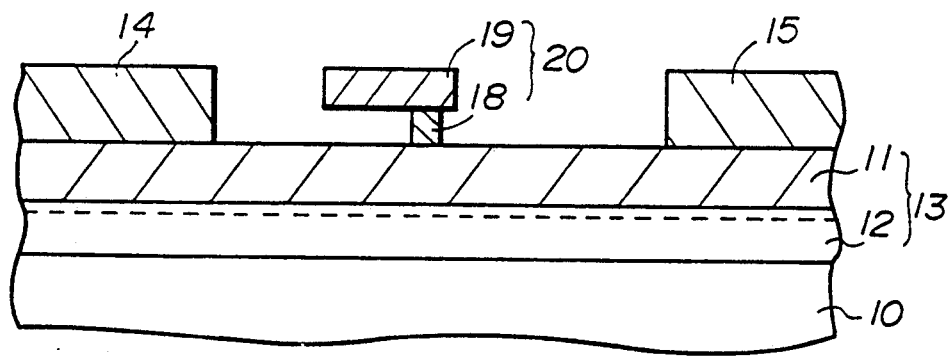

FIGS. 3(A) and 3(B) are respectively plan and cross-sectional illustrations of the fundamental structure of the quantum interference semiconductor device according to a first embodiment of the present invention.

Referring to these drawings, the quantum interference semiconductor device includes a semiinsulating GaAs substrate 10, and a channel layer 12 of undoped GaAs is provided on the substrate 10 with a thickness of 500 nm, for example. On the GaAs channel layer 12, there is provided an n-type AlGaAs layer 11 with a thickness of 45 nm and with the impurity concentration level of $1.4 \times 10^{18}$ cm$^{-3}$. AlGaAs, employed for the layer 11, has an electron affinity that is smaller than the electron affinity of GaAs, employed for the channel layer 12, the substrate 10, and the channel layer 12 and thus the n-type layer 11 forms a typical HEMT structure characterized by a two-dimensional electron gas formed in the channel layer 12 along the upper major surface thereof. Typically, the two-dimensional electron gas has the sheet carrier density of $3 \times 10^{11}$ cm$^{-2}$ and the mobility of 300,000 cm$^2$/V.s at 4.2° K.

On the upper major surface of the AlGaAs layer 11, there are provided source and drain electrodes 14, 15, each having the gold-germanium alloy/gold structure and thus in ohmic contact with the underlying AlGaAs layer 11. Similarly the conventional HEMT, the source electrode 14 injects electrons into the two-dimensional electron gas via the n-type AlGaAs layer 11, and the electrons thus injected move toward the drain electrode 15 along the two-dimensional electron gas.

Further, between the source and drain electrodes 14 and 15, a pair of Schottky electrodes 16 and 17 of aluminum are provided on the upper major surface of the AlGaAs layer 11 in correspondence to a region between the source electrode 14 and the drain electrode 15, such that depletion regions 16a and 17a, respectively formed in the underlying semiconductor layers by the Schottky electrodes 16 and 17, interrupt the flow of the electrons from the source electrode 14 to the drain electrode 15 except for a region corresponding to the gap between the Schottky electrodes 16 and 17. As can be seen in the plan view of FIG. 3(A), the Schottky electrodes 16 and 17 have opposing ends that are sharply pointed, and because of this, the length of the region that allows the passage of the electrons, measured in the direction of movement of the electrons, is limited to the order of 2 μm or less.

In correspondence to the region between the pointed ends of the Schottky electrodes 16 and 17, there is provided another minute Schottky electrode 18. Further, in order to connect an electric wiring to such minute electrode 18, an interconnection lead structure 19 provides a connection to the electrode 18. The interconnection lead structure 19 forms an air bridge structure 20 that extends along and is spaced from the upper major surface of the layer 11 and thus with a separation therefrom. Thereby, a control voltage such as the ground level voltage is applied to the electrode 18a and the extension of a depletion region 18a formed under the electrode 18 is controlled, as desired and irrespective of the voltages applied to the Schottky electrodes 16 and 17. In response to this, the quantum level of the quantum point contact between the electrode 16 and the electrode 18 and the quantum level of the quantum point contact between the electrode 17 and the electrode 18 are controlled independently and the phase of the electron waves passing through these quantum point contacts is controlled as desired. In one example, the lead structure 19 and thereby the electrode 18 may be connected to ground.

Figure 1A:
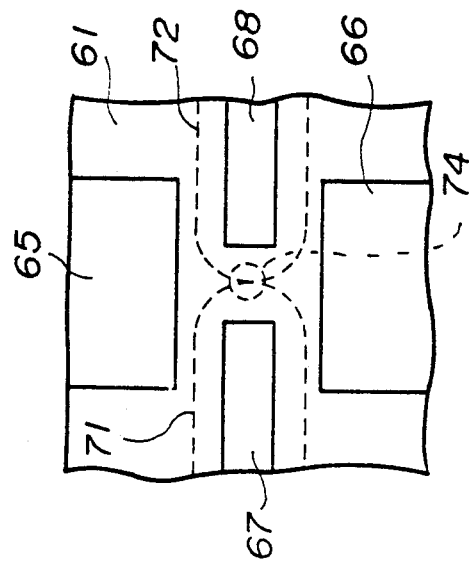
FIGS. 1(A)–1(D) are diagrams showing the structure of a conventional point contact semiconductor device in the biased state and unbiased state.
Figure 1B:
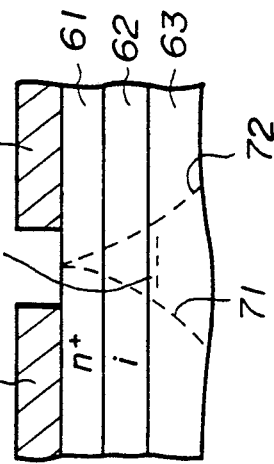
Figure 1C:
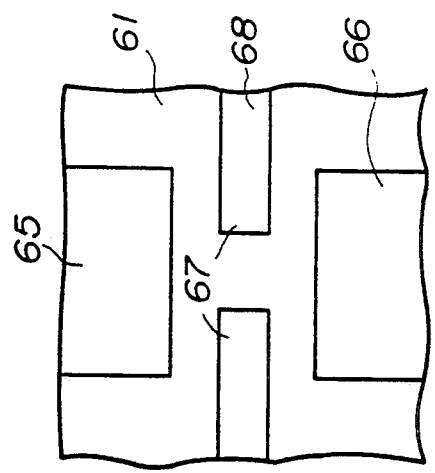
Figure 1D:
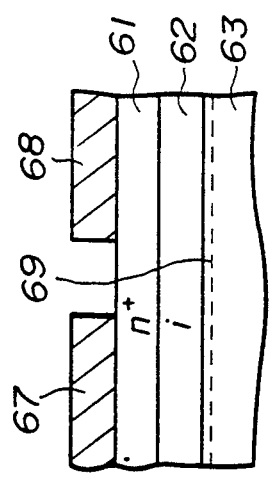
Figure 2A:
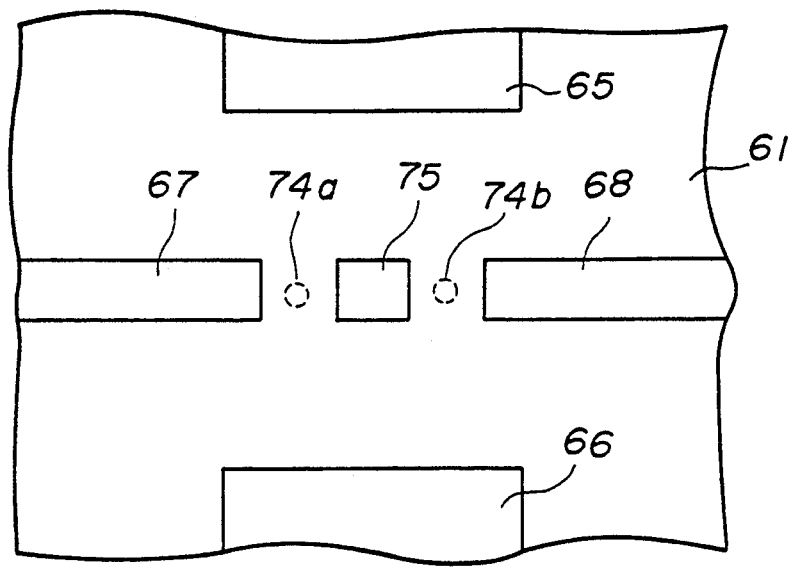
FIGS. 2(A)–2(C) are diagrams showing the structure and operational principle of a conventional quantum interference semiconductor device.
Figure 2B:
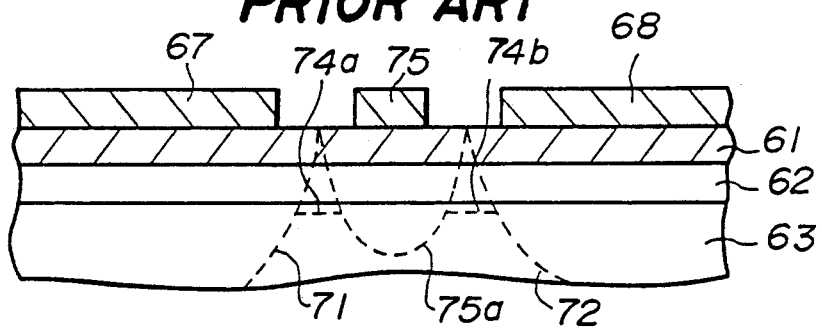
Figure 2C:
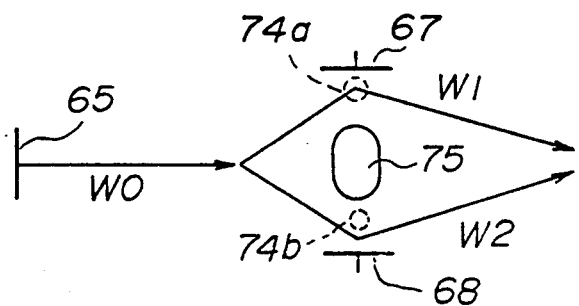
Figure 4:
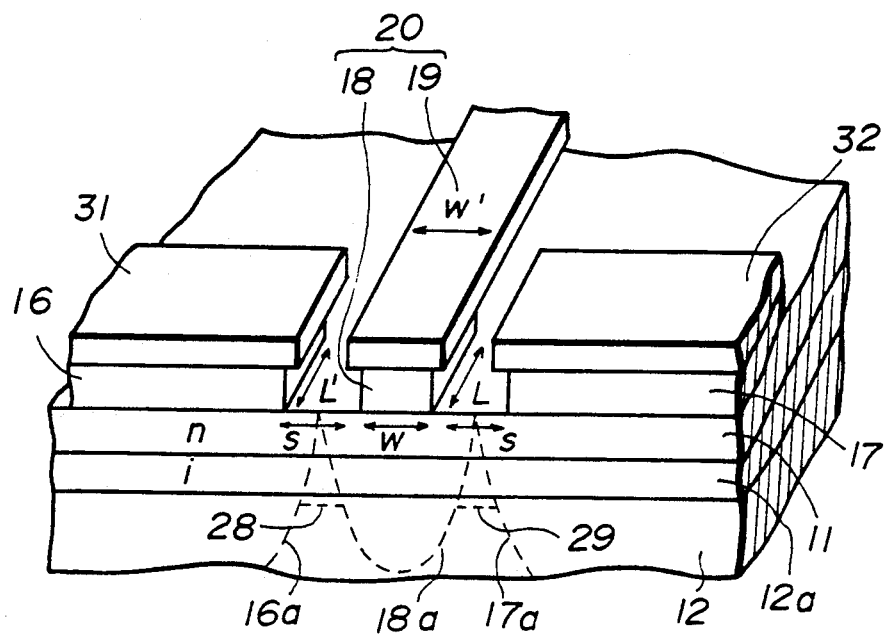
FIG. 4 is a perspective view of a quantum interference semiconductor device of the first embodiment in an enlarged scale.

FIG. 4 shows the first embodiment of the present invention on an enlarged scale, wherein FIG. 4 shows only the region of the device around the quantum point contacts. In FIG. 4, it can be seen that there is interposed an undoped AlGaAs layer 12a corresponding to the layer 62 of FIG. 1(B) between the channel layer 12 and the n-type layer 11 for decreasing the scattering of the electrons in the two-dimensional electron gas.

Referring to FIG. 4, the Schottky electrode 18 has a width W, measured in the lateral direction connecting the pointed ends of the electrodes 16 and 17, of about 0.2 μm, and a length L measured in the longitudinal direction perpendicular to the lateral direction, of 0.1 μm. Each of the sharply pointed ends of the Schottky electrodes 16 and 17 has actually a rectangular shape in this enlarged diagram such that the rectangular end has a longitudinal length of L' that may be approximately equal to the longitudinal length L of the electrode 18. The separation S between each of the electrodes 16 and 17 and the electrode 18 is set to about 0.3 μm.

On the electrode 18, the interconnection lead structure 19 of aluminum is formed to extend in the longitudinal direction with a width W' of less than 1 μm. Typically, the width W' is set to be 0.3 μm. Further, aluminum contact pads 31 and 32 are formed on the electrodes 16 and 17 in correspondence to the lead structure 19.

Figure 5:
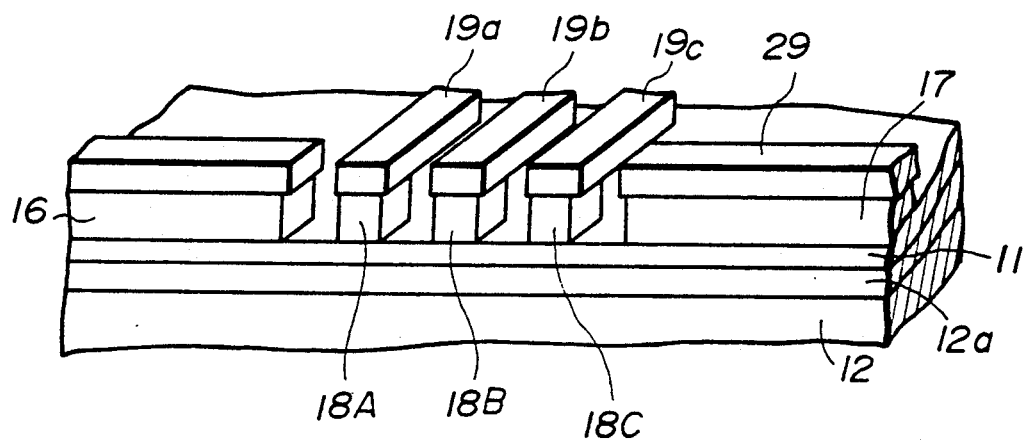
FIG. 5 is a perspective view of a quantum interference semiconductor device according to a second embodiment of the present invention.

It should be noted that the number of the Schottky electrodes 18 is not limited to one but there may be a plurality of Schottky electrodes in correspondence to the electrode 18. FIG. 5 shows a second embodiment of the present invention, wherein a plurality of Schottky electrodes 18A–18C are provided on the n-type AlGaAs layer 11 between the Schottky electrodes 16 and 17. In this structure, each of the electrodes 18A–18C has a size identical with the size of the electrode 18 of FIG. 4, and each electrode carries a corresponding air bridge lead structure 19a, 19b and 19c, respectively. In this structure, the number of quantum point contacts in one quantum interference semiconductor device is increased in correspondence to the increased number of Schottky electrodes 18A–18C, and the transconductance of the device is increased, for example from 77 μS to 77 μS×N, where N represents the number of quantum point contacts.

Figure 6:
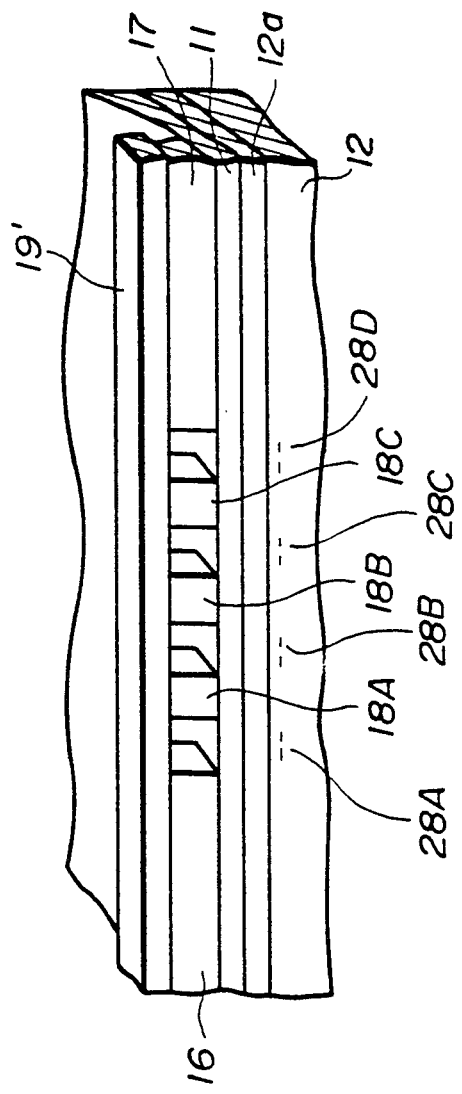
FIG. 6 is perspective view of a quantum interference semiconductor device according to a third embodiment of the present invention.

FIG. 6 shows a third embodiment of the present invention. In FIG. 6, those parts that have been described previously with reference to preceding drawings are designated by the same reference numerals and the description will be omitted.

In the device of FIG. 6, the Schottky electrodes 18A–18C are provided on the upper major surface of the n-type AlGaAs layer 11 in Schottky contact therewith, similar to the second embodiment. In this embodiment, all of the Schottky electrodes 18A–18C, and the Schottky electrodes 16 and 17 are connected with each other by an air bridge interconnection structure 19' as illustrated. Thereby, the quantum level of the quantum point contacts formed in the channel layer 12 between these Schottky electrodes is controlled at a common level, and in response thereto, the respective wave lengths of the electron waves which pass through the quantum point contacts have a common value. Thereby, a coherent electron wave having a planar wave front is obtained, exiting from quantum point contacts 28A–28D formed in the channel layer 12 in correspondence to the Schottky electrodes 16, 17, 28A–28D.

The planar electron wave thus created propagates straight in the direction perpendicular to the row of electrodes 28A–28D with an excellent directivity. Thereby, the chance of scattering of the electron wave by the impurities in the channel layer is substantially reduced, and the quantum interference semiconductor device that uses the structure of FIG. 6 for the control of the phase of the electron waves, exhibits an excellent signal-to-noise ratio.

It should be noted that the air bridge structure connecting two Schottky electrodes 16 and 17 as disclosed in FIG. 6 is useful also in a structure wherein there are no other Schottky electrodes, such as 18A–18C, provided between the gate electrodes 16 and 17. More specifically, such an air bridge structure keeps the potential level of the Schottky electrodes 16 and 17 equal with each other, and thereby the risk of causing a sparking discharge between the Schottky electrodes 16 and 17 is eliminated. Associated with the elimination of the sparking discharge, the deterioration of the surface morphology of the semiconductor layer 11 is avoided.

Next, the process for forming the quantum interference device of the present invention, particularly for forming the Schottky electrode 18 and the air bridge structure 19 of FIG. 4, will be described.

Figure 7A:
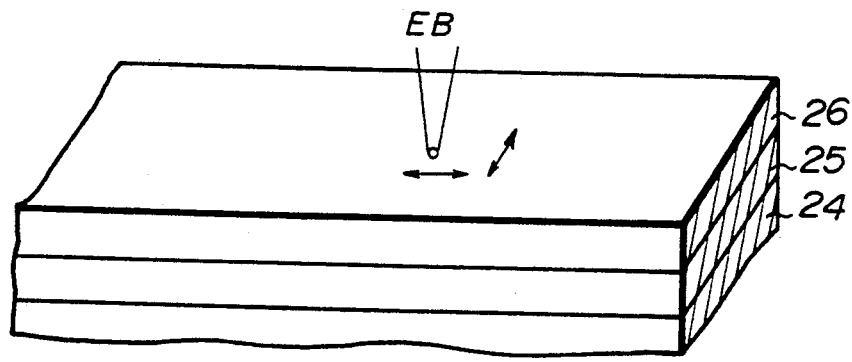
FIGS. 7(A)–7(C) are prospective views of the structure joined in successive steps of a first process for forming the first embodiment device.
Figure 7B:
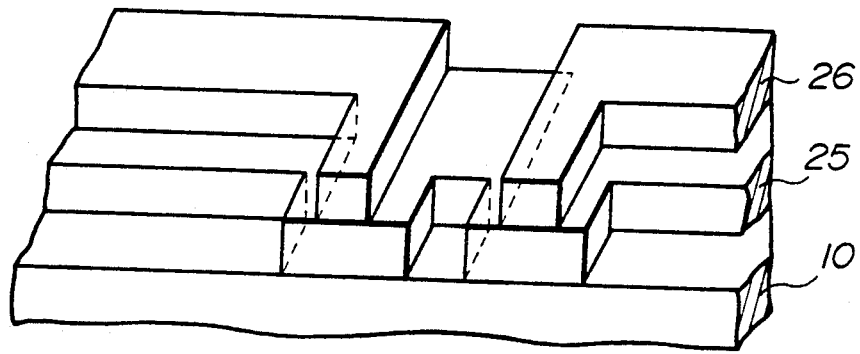

Referring to FIG. 7(A), a first electron beam resist 25 and a second electron beam resist 26 are applied consecutively on a semiconductor layered body 24 that includes (i.e., see FIG. 7(B)) the substrate 10, the channel layer 12, the insulating layer 12a, and the n-type layer 11. The source electrode 14 and the drain electrode 15 are already provided (i.e., see FIG. 7(C)) on the layered body 24.

The electron beam resist 25 comprises a PMMA compound available from NIPPON ZEON under the trade name ZCMR-100[7] and has a relatively low sensitivity. On the other hand, the electron beam resist 26 comprises another PMMA compound available from TORAY under the trade name EBR-9 and has a relatively high sensitivity. The electron beam resist 25 is deposited in a thickness or 3000 Å while the electron beam resist 26 is deposited in a thickness of 5000 Å. Further, the electron beam resist 25 and the electron beam resist 26 are written with a desired pattern by a scanning electron beam EB. The intensity of the electron beam EB is controlled between a high value and a low value such that when writing the pattern only in the resist 26, the intensity of the electron beam EB is set to the low level, while when writing the pattern into the resist 25, the intensity of the electron beam is set to the high level. Thereby, the low level state of the electron beam EB is set such that only the electron beam resist 26 is exposed while the electron beam resist 25 remains unexposed. In a typical example, the high level state of the electron beam intensity is set at 5 Acm$^{-2}$ and the low level state of the electron beam intensity is set also at 5 Acm$^{-2}$, provided that the acceleration voltage of the electron beam is set at 30 kV. It should be noted that, as the low sensitivity electron beam resist 25 is already exposed by the low level electron beam when writing the pattern into the electron beam resist 26, though with no change in the electron beam resist 25 because of the low sensitivity, the same effect as writing the pattern into the electron beam resist 25 by an electron beam with increased intensity is obtained in the foregoing double exposure process, without changing the intensity of the electron beam.

Figure 7C:
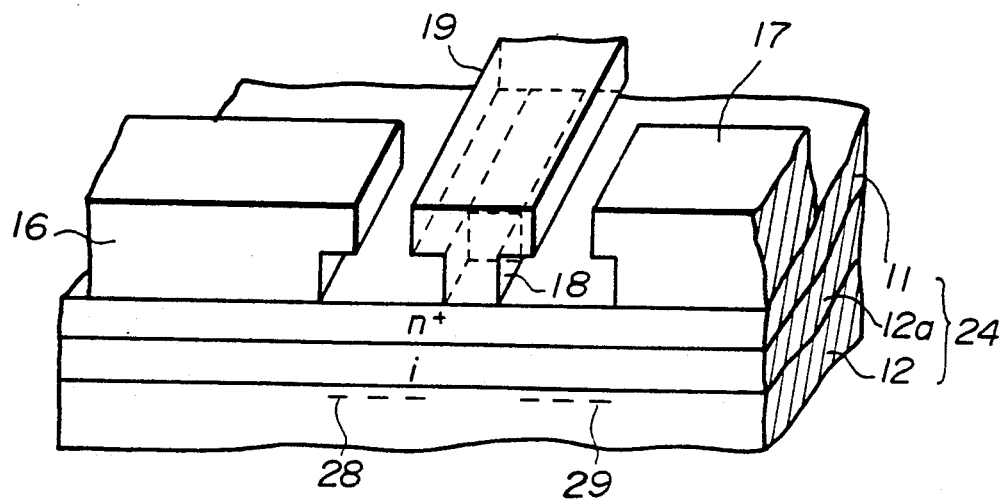

FIG. 7(B) shows the state in which the electron beam resists 26 and 25 are developed. On this structure, an aluminum layer (not shown) in deposited by a sputtering process, and the electron beam resists 25 and 26 are lifted off. Thereby the structure shown in FIG. 7(C) is obtained, wherein the air bridge structure 19 makes a contact to the layer 11 at the electrode 18.

In the above process, it should be noted that the patterning of the air bridge structure 19 can be achieved as desired and the Schottky electrode 18 is connected to a bonding pad (not shown) formed in an appropriate location of the device away from the active region shown in FIG. 3(A). As the fabrication process of the device of FIG. 5 or FIG. 6 is obvious from the process of FIGS. 7(A)–7(C), the description thereof will be omitted.

FIGS. 8(A)–8(E) show another process for forming the structure of FIG. 4.

Figure 8A:
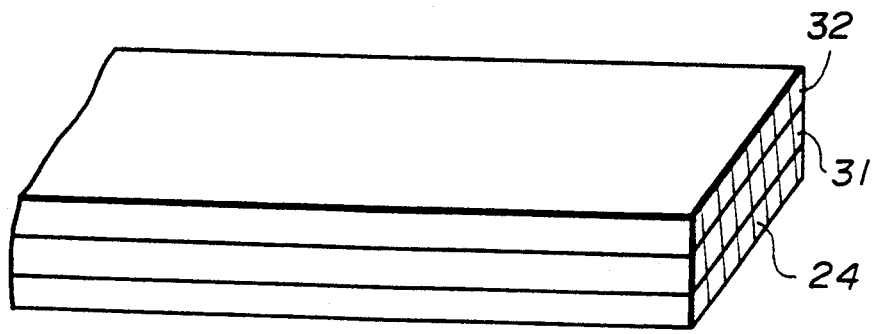
FIGS. 8(A)–8(E) are perspective views of the structure joined in successive steps of a second process for forming the first embodiment device.

Referring to FIG. 8(A), an insulator layer 31 of SiO$_2$ or Si$_3$N$_4$ is provided on the upper major surface of the layered semiconductor body 24 with a thickness of 2000 Å, and on the upper major surface of the insulator layer 31, there is provided an electron beam resist 32 of PMMA with a thickness of 3000 Å.

Figure 8B:
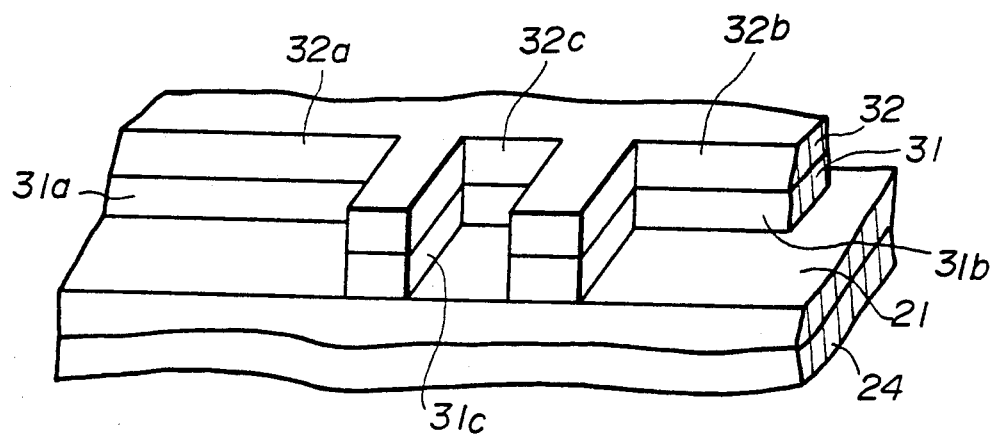

Next, in the step of FIG. 8(B), the electron beam resist 31 is patterned and developed. Thereby, the electron beam resist 31 is removed at regions 32a and 32b in correspondence to the Schottky electrodes 16 and 17 to be formed. Further, the electron beam resist 31 is removed at a region 32c in correspondence to the Schottky electrode 18. Next, using the patterned electron beam resist 31 as the mask, the insulator layer 31 is patterned by a dry etching process, using CHF$_3$ as the etching gas when the layer 31 is made of SiO$_2$. When the layer 31 is made of Si$_3$N$_4$, on the other hand, SF$_6$ is used for this purpose. Thereby, the insulator layer 31 is removed at regions 31a and 31b in correspondence to the Schottky electrodes 16 and 17 and further at a region 31c in correspondence to the Schottky electrode 18 as shown in FIG. 8(B).

Figure 8C:
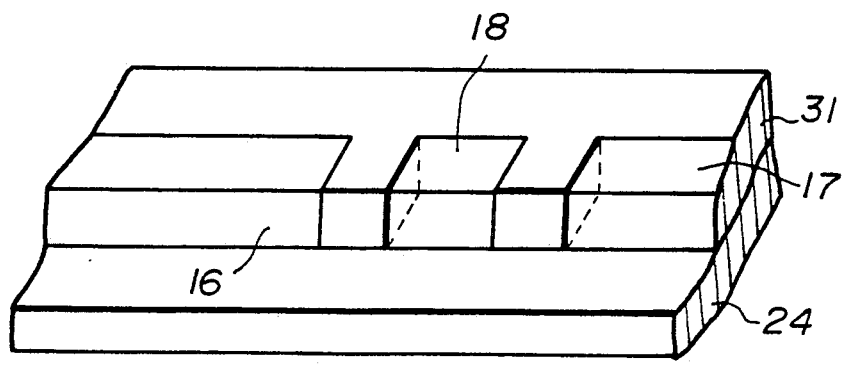

Next, a metal layer such as aluminum is sputtered on the structure of FIG. 8(B) and subsequently lifted off. As a result, the metal layer deposited on the electron beam resist 31 is removed together with the electron beam resist 31, leaving aluminum filling the regions 31a, 31b and 31c of the insulator layer 31. Thereby, the structure shown in FIG. 8(C) is obtained.

Figure 8D:
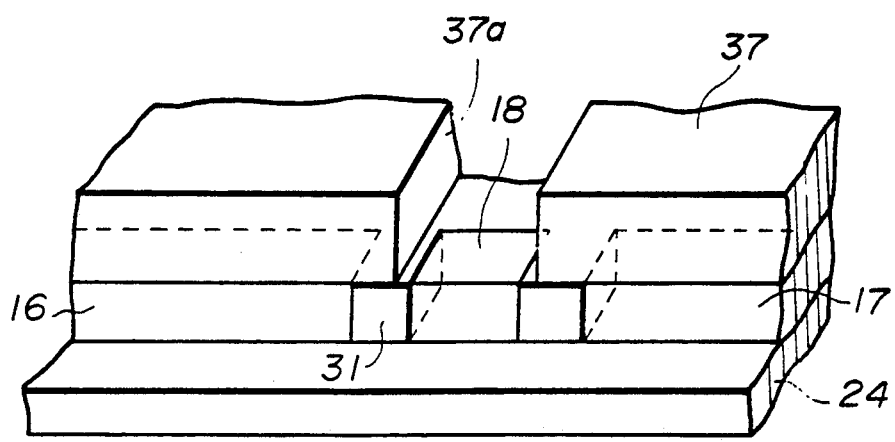

Next, on the structure of FIG. 8(C), an electron beam resist 37 of PMMA is deposited by spinning, and patterned subsequently as shown in FIG. 8(D) to expose the top surface of the structure of FIG. 8(C) in correspondence to a region 37a where the interconnection lead structure 19 is to be formed. In FIG. 8(D), the electron beam resist 37 that covers the exposed upper major surface of the layered semiconductor body 24 is not illustrated for the sake of simplicity of the drawing.

Figure 8E:
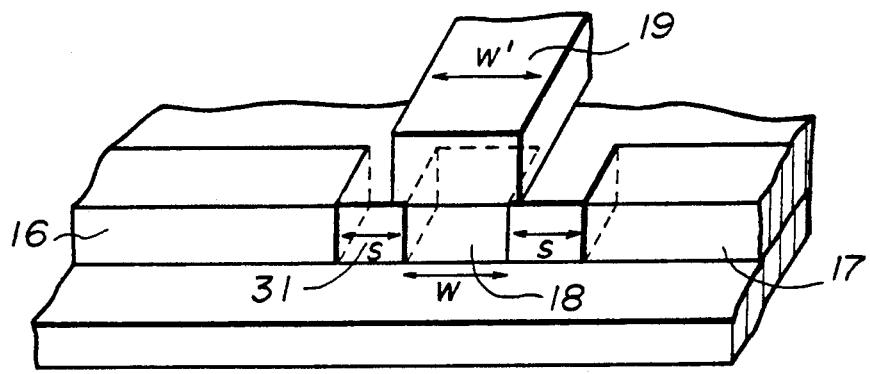

Further, by depositing a metal layer such as aluminum on the structure of FIG. 8(D) and subsequent lifting off, the electron beam resist 37 is removed together with the remaining metal layer on the resist 37, and the structure shown in FIG. 8(E) is obtained.

With the foregoing process, a submicron air bridge structure including the electrode 18 and the inter connection lead 19 is formed with reliability. Similar to the previous process, the electrode 18 has the width W of 0.2 μm and the lead 19 has the width W' of 0.5 μm or less, with a lateral separation s between the electrode 18 and each of the electrode 16 and the electrode 17 of about 0.3 μm.

It should be noted that the material forming the Schottky electrode 18 is not limited to aluminum, but other materials or material systems such as a layered structure of Ti/Au with a titanium layer in contact with the upper major surface of the layered body 24 and a gold layer formed on the titanium layer, may be employed. In this case, the interconnection lead 19 may comprise gold. Alternatively, the Schottky electrode 18 may have a layered structure of a titanium layer at the bottom in contact with the layered semiconductor body 24, a platinum layer formed on the titanium layer and a gold layer formed further on the platinum layer. Further, a tungsten silicide layer or a structure including a tungsten silicide layer in contact with the upper major surface of the semiconductor body 24 may be employed.

Further, the present invention is not limited to the embodiments described heretofore, but various variations and modifications may be made without departing from the scope of the invention.

What is claimed is:

1. A quantum interference semiconductor device, comprising:
    a channel layer, of a first semiconductor material having a first electron affinity, having an upper major surface and a lower major surface;
    a carrier supplying layer, of a second semiconductor material having a second electron affinity smaller than the first electron affinity, having an upper major surface and a lower major surface and with the lower major surface thereof disposed on the upper major surface of the channel layer, the carrier supplying layer supplying carriers into the channel layer and a two-dimensional carrier gas thereby being formed in the channel layer along the upper major surface thereof;
    source electrode means, provided on the upper major surface of the carrier supplying layer and in ohmic contact therewith, for injecting carriers into the two-dimensional carrier gas via the carrier supplying layer;
    drain electrode means, provided on the upper major surface of the carrier supplying layer and in ohmic contact therewith and displaced in a first direction from the source electrode means and defining a corresponding region of the carrier supplying layer therebetween, for collecting carriers which have been injected by the source electrode means into the channel layer and which have travelled through the channel layer in the first direction along the two-dimensional carrier gas;
    first and second Schottky electrodes provided in the region on the upper major surface of the carrier supplying layer, each forming a Schottky contact therewith, between the source and drain electrode means and in separated, opposing relationship in a second direction, transverse to the first direction, and defining a gap between the respective, opposing ends thereof, the first and second Schottky electrodes respectively producing selectively controllable first and second depletion regions extending into the channel layer thereby to interrupt the flow of carriers through the two-dimensional gas in the first direction from the source electrode means to the drain electrode means;
    at least one isolated Schottky electrode provided within the gap on the upper major surface of the carrier supplying layer in Schottky contact therewith and producing a corresponding and selectively controllable further depletion region extending into the channel layer intermediate the first and second depletion regions and defining respective passageways between the opposite sides of the further depletion region and the respective, adjacent sides of the first and second depletion regions for the carriers moving in the first direction and in the form of a quantum mechanical wave, each passageway having a width, measured in the second direction, approximately equal to or smaller than the de Broglie wavelength of the carriers and a length, measured in the first direction, approximately equal to or smaller than any of the elastic and inelastic scattering lengths of the carriers in the channel layer;
    at least one conductor strip, corresponding to and electrically connected to the at least one isolated Schottky electrode, extending along, and in spaced relationship relative to, the upper major surface of the carrier supplying layer; and
    means for supplying respective and independent control voltages to the first and second opposing Schottky electrodes and to the isolated Schottky electrode for independently controlling the corresponding carrier passageways defined in the channel layer by the corresponding depletion regions of the isolated Schottky electrode and the first and second opposing Schottky electrodes.

2. A quantum interference semiconductor device as recited in claim 1, wherein the isolated Schottky electrode has a first dimension in the first direction and a second dimension in a second direction and wherein the first dimension is substantially larger than the second dimension.

3. A quantum interference semiconductor device as recited in claim 2, wherein the first dimension is substantially smaller than one μm and the second dimension is approximately 0.2 μm.

4. A quantum interference semiconductor device as recited in claim 3, wherein the first dimension is approximately 0.3 μm.

5. A quantum interference semiconductor device as recited in claim 3, wherein the gap has common first and second dimensions, respectively in the first and second directions, of approximately 0.3 μm.

6. A quantum interference semiconductor device as recited in claim 1, further comprising an insulator layer formed on the upper major surface of the carrier supplying layer, the conductor strip being imbedded in the insulator layer.

* * * * *

UNITED STATES PATENT AND TRADEMARK OFFICE
CERTIFICATE OF CORRECTION

PATENT NO. : 5,270,557

DATED : December 14, 1993

INVENTOR(S) : SCHMIDT

It is certified that error appears in the above-indentified patent and that said Letters Patent is hereby corrected as shown below:

Col. 5, line 24, change "prospective" to --perspective--;
line 57, after "Similarly" insert --to--.

Signed and Sealed this

Fourth Day of October, 1994

Attest:

BRUCE LEHMAN

Attesting Officer      Commissioner of Patents and Trademarks